United States Patent
Kobayashi et al.

(10) Patent No.: US 10,209,373 B2
(45) Date of Patent: Feb. 19, 2019

(54) PHOTODETECTOR AND DETECTION DEVICE

(71) Applicant: Kabushiki Kaisha Toshiba, Minato-ku (JP)

(72) Inventors: Mitsuyoshi Kobayashi, Ota (JP); Rei Hasegawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/691,129

(22) Filed: Aug. 30, 2017

(65) Prior Publication Data
US 2018/0210093 A1    Jul. 26, 2018

(30) Foreign Application Priority Data

Jan. 20, 2017  (JP) .................. 2017-008554

(51) Int. Cl.
*G01T 1/20* (2006.01)
*H01L 51/44* (2006.01)
*H01L 51/00* (2006.01)
*H01L 27/30* (2006.01)
*H01L 27/28* (2006.01)

(52) U.S. Cl.
CPC .......... *G01T 1/2018* (2013.01); *H01L 27/281* (2013.01); *H01L 27/305* (2013.01); *H01L 51/0097* (2013.01); *H01L 51/44* (2013.01)

(58) Field of Classification Search
CPC .... G01T 1/2018; H01L 27/281; H01L 27/305
See application file for complete search history.

(56) References Cited

U.S. PATENT DOCUMENTS

| | | | |
|---|---|---|---|
| 8,384,034 B2 | 2/2013 | Nakamura | |
| 8,766,085 B2 | 7/2014 | Tokioka et al. | |
| 2013/0126743 A1* | 5/2013 | Iwakiri | A61B 6/4216 250/366 |
| 2017/0016829 A1* | 1/2017 | Swihart | G02B 6/08 |
| 2018/0156930 A1 | 6/2018 | Taguchi et al. | |

FOREIGN PATENT DOCUMENTS

| | | |
|---|---|---|
| JP | 3-273687 | 12/1991 |
| JP | 5-55622 | 3/1993 |
| JP | 5518045 | 6/2014 |
| JP | 2018-91680 A | 6/2018 |
| WO | WO 2009/037781 A1 | 3/2009 |

* cited by examiner

*Primary Examiner* — Hugh H Maupin
(74) *Attorney, Agent, or Firm* — Olbon, McClelland, Maier & Neustadt, L.L.P.

(57) ABSTRACT

According to an embodiment, a photodetector includes a first photoelectric conversion element, a second photoelectric conversion element, and an absorption layer. The first photoelectric conversion element includes a first photoelectric conversion layer for converting energy of radiation into electric charges. The second photoelectric conversion element includes a second photoelectric conversion layer for converting energy of radiation into electric charges. The absorption layer is arranged between the first photoelectric conversion element and the second photoelectric conversion element to absorb radiation having energy equal to or lower than a threshold value.

9 Claims, 12 Drawing Sheets

PHOTODETECTOR AND DETECTION DEVICE

CROSS-REFERENCE TO RELATED APPLICATIONS

This application is based upon and claims the benefit of priority from Japanese Patent Application No. 2017-008554, filed on Jan. 20, 2017; the entire contents of which are incorporated herein by reference.

FIELD

Embodiments described herein relate generally to a photodetector and a detection device.

BACKGROUND

There is known a photodetector for detecting electric charges converted at a photoelectric conversion layer. For example, a configuration is known in which a photoelectric conversion layer is arranged between a pair of electrode layers, and charges converted at the photoelectric conversion layer are read through electrodes.

Herein, incident radiation to the photoelectric conversion layer tends to show high transmittance as the radiation energy is higher. Therefore, a configuration where a plurality of photoelectric conversion layers are stacked is disclosed. However, in the case of the configuration where simply a plurality of photoelectric conversion layers are stacked, in order to detect radiation of energy having a target intensity, it is necessary to increase the thickness of the photoelectric conversion layer or to increase the number of stacked photoelectric conversion layers. For this reason, in conventional photodetectors, it has been difficult to easily improve the detection accuracy of radiation.

DETAILED DESCRIPTION

According to an embodiment, a photodetector includes a first photoelectric conversion element, a second photoelectric conversion element, and an absorption layer. The first photoelectric conversion element includes a first photoelectric conversion layer for converting energy of radiation into electric charges. The second photoelectric conversion element includes a second photoelectric conversion layer for converting energy of radiation into electric charges. The absorption layer is arranged between the first photoelectric conversion element and the second photoelectric conversion element to absorb, radiation having energy equal to or lower than a threshold value.

Hereinafter, details of the embodiment will be described with reference to the accompanying drawings.

Figure 1:
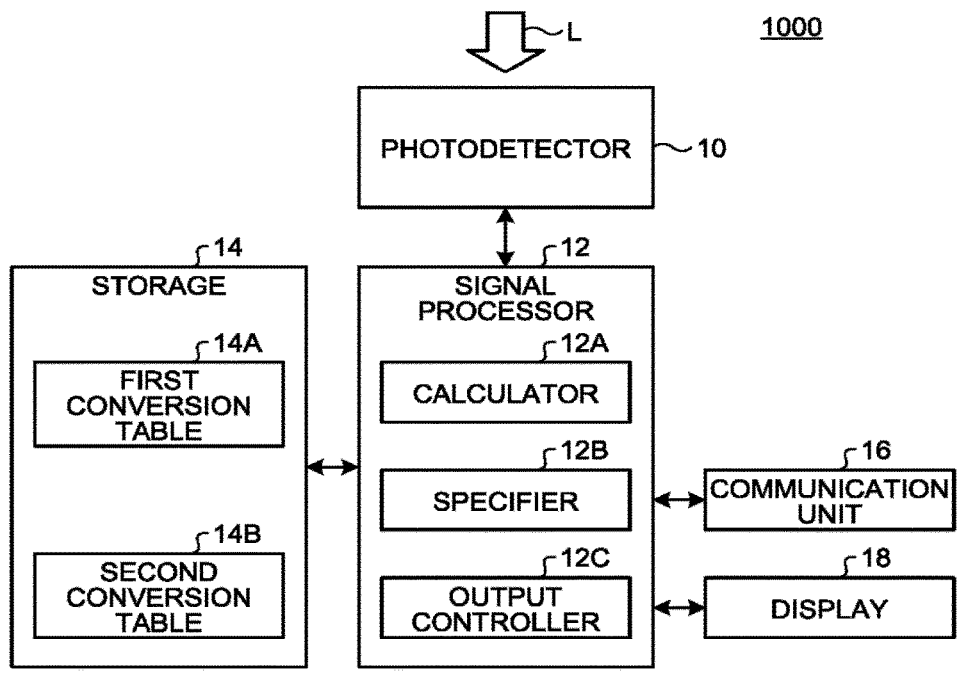
FIG. 1 is a schematic diagram illustrating an example of a detection device.

FIG. 1 is a schematic diagram illustrating an example of a detection device 1000.

The detection device 1000 is configured to include a photodetector 10, a signal processor 12, a storage 14, a communication unit 16, and a display 18. The photodetector 10, the storage 14, the communication unit 16, the display 18, and the signal processor 12 are connected so as to be able to transmit and receive data and signals.

The photodetector 10 outputs an output signal corresponding to incident radiation L. The signal processor 12 specifies detection energy of the radiation L incident on the photodetector 10 by using the output signal acquired from the photodetector 10.

The storage 14 stores various data. The communication unit 16 communicates with an external device via a network or the like. In the embodiment, the communication unit 1 transmits information indicating a specification result by the signal processor 12 to the external device. The display 18 displays various images. In the embodiment, the display 18 displays the information indicating the specification result by the signal processor 12.

In addition, the detection device 1000 may be configured to include any one of the display 18 and the communication unit 16. In addition, each component constituting the detection device 1000 may be accommodated in one casing or may be divided and arranged in a plurality of casings.

Photodetector 10

First, the photodetector 10 will be described.

Figure 2:
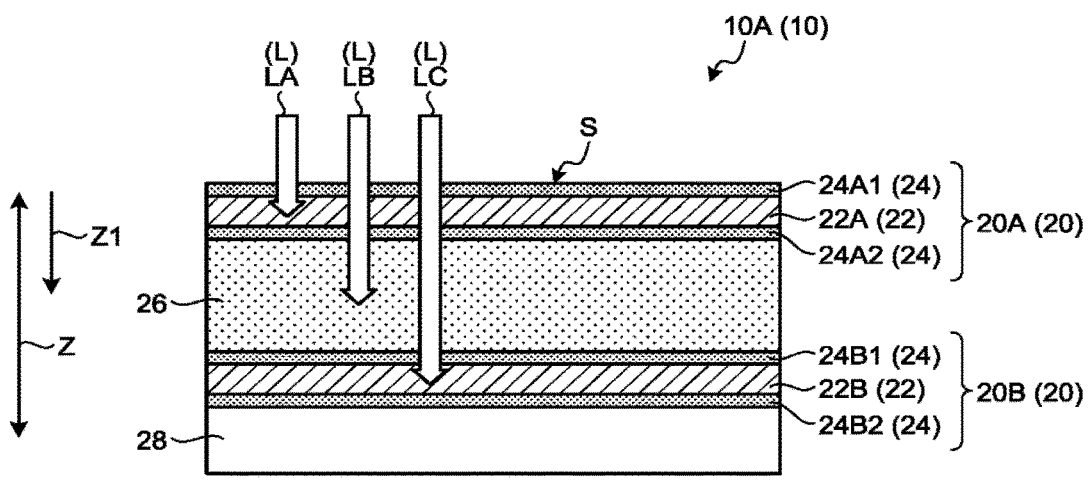
FIG. 2 is a schematic diagram illustrating a photodetector.

FIG. 2 is a schematic diagram illustrating a photodetector 10A. The photodetector 10A is an example of the photodetector 10.

Photodetector 10A

The photodetector 10A is configured to include a first photoelectric conversion element 20A, an absorption layer 26, a second photoelectric conversion element 20B, and a substrate 28.

The photodetector 10 is a stacked product in which the second photoelectric conversion element 20B, the absorption layer 26, and the first photoelectric conversion element 20A are stacked in this order on the substrate 28.

The substrate 28 is a component that supports the first photoelectric conversion element 20A, the absorption layer 26, and the second photoelectric conversion element 20B.

The substrate 28 is made of, for example, silicon. In addition, a constituent material of the substrate 28 is not limited to silicon.

Next, the first photoelectric conversion element 20A and the second photoelectric conversion element 20B will be described. The first photoelectric conversion element 20A and the second photoelectric conversion element 20B have the similar configuration. In the description, the first photoelectric conversion element 20A and the second photoelectric conversion element 20B are collectively referred to as a photoelectric conversion element 20.

In the embodiment, the first photoelectric conversion element 20A is arranged on the up side of the second photoelectric conversion element 20B in the incident direction of the radiation L (arrow Z1 direction).

The first photoelectric conversion element 20A is configured to include a first photoelectric conversion layer 22A, an electrode 24A1, and an electrode 24A2. In the embodiment, the first photoelectric conversion layer 22A is arranged between the electrode 24A1 and the electrode 24A2.

The second photoelectric conversion element 20B is configured to include a second photoelectric conversion layer 22B, an electrode 24B1, and an electrode 24B2. In the embodiment, the second photoelectric conversion layer 22B is arranged between the electrode 24B1 and the electrode 24B2.

First, the first photoelectric conversion layer 22A and the second photoelectric conversion layer 22B will be described. In the description, the first photoelectric conversion layer 22A and the second photoelectric conversion layer 22B will be collectively referred to as a photoelectric conversion layer 22.

The photoelectric conversion layer 22 converts energy of the radiation L into electric charges. The photoelectric conversion layer 22 contains, for example, an inorganic material such as amorphous silicon, a CIGS (a compound of copper, indium, gallium, and selenium), an organic material, or the like as main ingredients. The main ingredient denotes that the content is 70% or more. In addition, as the photoelectric conversion layer 22, organic photoelectric conversion film with a panchromatic photosensitive material may be used.

The constituent material of the photoelectric conversion layer 22 is not limited to the above material. In addition, the photoelectric conversion layer 22 may have wavelength selectivity. The wavelength selectivity denotes that light having a wavelength other than a wavelength range to be photoelectrically converted is transmitted. For example, the first photoelectric conversion layer 22A and the second photoelectric conversion layer 22B may be different in wavelength selectivity. In this case, for example, the first photoelectric conversion layer 22A may have a configuration containing quinacridone, subphthalocyanine, or the like.

It is preferable that the photoelectric conversion layer 22 contain an organic material as a main ingredient.

If the photoelectric conversion layer 22 containing an organic material as a main ingredient is used, resistivity of the photoelectric conversion layer 22 can be allowed to be high as compared with a case where an organic material is not contained as a main ingredient. The higher the resistivity of the photoelectric conversion layer 22 is, the more the electric charges generated in the photoelectric conversion layer 22 can be prevented from spreading to the regions corresponding to other pixel areas in the photoelectric conversion layer 22. In other words, it is possible to suppress charges from other pixel areas from being mixed into each pixel area.

In addition, the region of the photoelectric conversion layer 22 corresponding to the pixel area may be defined in advance by adjusting the arrangement of the electrodes 24 (the electrode 24A1, the electrode 24A2, the electrode 24B1, and the electrode 24B2).

The thickness of the photoelectric conversion layer 22 is not limited. The thickness coincides with the length of the photodetector 10A in the stacked direction (direction of arrow 2). The stacked direction is the direction in which each layer (the first photoelectric conversion element 20A, the second photoelectric conversion element 20E, and the like) constituting the photodetector 10A is stacked.

The thickness of each of the photoelectric conversion layers 22 (the thickness of each of the first photoelectric conversion layer 22A and the second photoelectric conversion layer 22B) is, for example, in a range of 1 nm or more and 1 mm or less, and preferably in a range of 1 µm or more and 500 µm or less.

Next, the electrode 24 will be described. The electrode 24 is a generic term for the electrode 24A1, the electrode 24A2, the electrode 24131, and the electrode 24B2.

The electrode 24 may be made of a material having conductivity. The electrode 24 is made of, for example, ITC, graphene, ZnO, aluminum, gold or the like.

The thickness of the electrode 24 is not limited. The thickness of the electrode 24 is, for example, 35 nm.

In the embodiment, a case where the first photoelectric conversion layer 22A is arranged between the electrode 24A1 and the electrode 24A2 will be described. More specifically, the first photoelectric conversion layer 22A is arranged to be interposed between the electrode 24A1 and the electrode 24A2 from both sides in the stacked direction (direction of arrow 2). However, at least one of the electrode 24A1 and the electrode 24A2 may be arranged on the side surface of the first photoelectric conversion layer 22A. The aide surface of the first photoelectric conversion layer 22A is an end surface of the first photoelectric conversion layer 22A in a direction perpendicular to the stacked direction (direction of arrow 2).

Similarly, in the embodiment, the second photoelectric conversion layer 22B is arranged between the electrode 24B1 and the electrode 24B2. More specifically, the second photoelectric conversion layer 22B is arranged to be interposed between the electrode 24B1 and the electrode 24B2 from both sides in the lamination direction (direction of arrow 2). However, at least one of the electrode 24B1 and the electrode 24B2 may be arranged on the side surface of the second photoelectric conversion layer 22B. The side surface of the second photoelectric conversion layer 22B is an end surface of the second photoelectric conversion layer 22B in a direction perpendicular to the stacked direction (direction of arrow Z).

Next, the absorption layer 26 will be described. In the embodiment, the absorption layer 26 is arranged between the first photoelectric conversion element 20A and the second photoelectric conversion element 20B. More specifically, the first photoelectric conversion element 20A is arranged on the up side of the absorption layer 26 in the stacked direction (direction of arrow 2), and the second photoelectric conversion element 20B is arranged on the down side in the stacked direction.

In addition, the absorption layer 26 may be in contact with at least one of the first photoelectric conversion element 20A and the second photoelectric conversion element 20B. In addition, the absorption layer 26 may be separated from both e first photoelectric conversion element 20A and the second photoelectric conversion element 20B. In a case where the absorption layer 26 is in contact with at least one of the first photoelectric conversion element 20A and the second photoelectric conversion element 20B, the contact may be surface contact or point contact.

More specifically, other layers such as an adhesive layer may be provided between the first photoelectric conversion element 20A and the absorption layer 26. In addition, on the surface of the first photoelectric conversion element 20A, a light shielding film or the like for shielding external light may be formed. In addition, the first photoelectric conversion element 20A and the absorption layer 26 may be arranged to be in contact with each other. In addition, other layers such as an adhesive layer may be provided between the second photoelectric conversion element 20B and the absorption layer 26. In addition, on the surface of the second photoelectric conversion element 20B, a light shielding film or the like for shielding external light may be formed. In addition, the first photoelectric conversion element 20A and the absorption layer 26 may be arranged to be in contact with each other.

The absorption layer 26 absorbs the radiation L. The absorption of the radiation L denotes that, for example, 80% or more of the incident radiation L is absorbed. In addition, it is particularly preferable that the absorption layer 26 absorb 90% or more of the incident radiation L.

In the embodiment, the absorption layer 26 absorbs the radiation L having energy equal to or lower than a threshold value. Namely, in the embodiment, the absorption layer 26 absorbs the radiation L having energy equal to or lower than the threshold value at least within the range of the absorption rate.

As a threshold value of the energy absorbed by the absorption layer 26, a value larger than zero may be set in advance. In addition, in the following description, the threshold value of the energy absorbed by the absorption layer 26 is sometimes simply referred to as a "threshold value for the absorption layer 26".

More specifically, the threshold value for the absorption layer 26 may be set in advance according to, for example, the energy of the radiation L that can be photoelectrically converted by the photoelectric conversion element 20 arranged on the up side of the absorption layer 26 in the incident direction of the radiation L. In the embodiment, the photoelectric conversion element 20 arranged on the up side of the absorption layer 26 in the incident direction of the radiation L is the first photoelectric conversion element 20A. In addition, in the embodiment, the photoelectric conversion element 20 arranged on the down side of the absorption layer 26 in the incident direction of the radiation L is the second photoelectric conversion element 20B.

More specifically, as a threshold value for the absorption layer 26, a value that is larger than a maximum value of the energy of the radiation L that can be photoelectrically converted by the first photoelectric conversion element 20A arranged on the up side of the absorption layer 26 in the incident direction of the radiation L and is smaller than a maximum value of the energy of the radiation L that can be photoelectrically converted by the second photoelectric conversion element 20B arranged on the down side of the absorption layer 26 in the incident direction of the radiation L may be set in advance.

In other words, as a threshold value for the absorption layer 26, a value that is within a range of the energy of the radiation L that passes through the first photoelectric conversion element 20A arranged on the up side of the absorption layer 26 in the incident direction of the radiation L and is smaller than the maximum value of the energy of the radiation L that can be photoelectrically converted by the second photoelectric conversion element 20B arranged on the down side of the absorption layer 26 in the incident direction of the radiation L may be set in advance.

Namely, the threshold value for the absorption layer 26 may be set in advance according to a positional relationship between the photoelectric conversion element 20 and the absorption layer 26 provided in the photodetector 10 and a configuration of the photoelectric conversion element 20.

The threshold value for the absorption layer 26 can be adjusted by changing the constituent material, the density, the thickness, or the like of the absorption layer 26.

The type of the radiation L absorbed by the absorption layer 26 is not limited. The type of the radiation L absorbed by the absorption layer 26 is, for example, at least one of beta rays, heavy particle rays, and gamma rays. It is particularly preferable that the absorption layer 26 absorb beta rays.

The type of the radiation L to be absorbed by the absorption layer 26 can be adjusted by changing the constituent material, the density, the thickness, or the like of the absorption layer 26.

In addition, in some cases, according to the constituent material, the absorption layer 26 may have a photoelectric conversion function. However, the absorption layer 26 has lower photoelectric conversion efficiency than the photoelectric conversion layer 22 provided in the photodetector 10A. The photoelectric conversion efficiency is conversion efficiency for converting incident radiation L into electric charges. The conversion of the radiation L into electric charges denotes the photoelectric conversion. In addition, it is most preferable that the absorption layer 26 do not have a photoelectric conversion function.

Namely, the thickness, the constituent material, and the density of the absorption layer 26 may be adjusted in advance according to the type of the radiation L to be absorbed by the absorption layer 26, the threshold value for the absorption layer 26, and the desired photoelectric conversion efficiency of the absorption layer 26.

The constituent material of the absorption layer 26 is, for example, glass, silicon, an organic material, or the like. The organic material is, for example, PET, PEN, or polycarbonate. Among the organic materials, in a case where the photodetector 10 is made of a foldable material, the distance between the photoelectric conversion elements does not change even when the photodetector is folded, so that it is preferable that the absorption layer 26 contain an organic material. In this case, it is preferable that the absorption layer 26 contain at least one of the above organic materials at a content rate of 50% or more.

In addition, in a case where the type of the radiation L to be absorbed is beta rays or heavy particle rays, it is preferable that the constituent material of the absorption layer 26 be, for example, an organic material.

In addition, in a case where the type of the radiation L to be absorbed is gamma rays, it is preferable that the constituent material of the absorption layer 26 be, for example, iron, tungsten, molybdenum, lead, or gold.

The thickness of the absorption layer 26 is not limited. As described above, the thickness of the absorption layer 26 may be appropriately adjusted according to the type of the radiation L to be absorbed by the absorption layer 26, the threshold value for the absorption layer 26, and the desired photoelectric conversion efficiency of the absorption layer 26.

For example, in a case where the type of the radiation L to be absorbed by the absorption layer is beta rays, the thickness of the absorption layer 26 in the case of converting a stopping power by aluminum, is preferably 7 μm or more and 30 mm or less, more preferably 100 μm or more and 5 mm or less, and particularly preferably 130 μm or more and 400 μm or less. In a case where the thickness of the absorption layer 26 is in a range of 7 μm or more and 30 mm or less, it is possible to appropriately absorb beta rays having energy equal to or lower than the threshold value for the absorption layer 26.

As described above, the density of the absorption layer 26 may be appropriately adjusted according to the type of the radiation L to be absorbed by the absorption layer 26, threshold value for the absorption layer 26, and the desired photoelectric conversion efficiency of the absorption layer 26. For example, the density of the absorption layer 26 is preferably in a range of 0.01 g/cm$^3$ or more and 30 g/cm$^3$ or less, more preferably 0.5 g/cm$^3$ or more and 26.5 g/cm or less, and particularly preferably in a range of 1.0 g/cm$^3$ or more and 20.0 g/cm$^3$ or less.

The radiation L is incident on the photodetector 10A configured in this manner from the first photoelectric conversion element 20A side to the substrate 28 side. Radiation LA which is a portion of the radiation L incident on the photodetector 10A is converted into electric charges by the first photoelectric conversion layer 22A. Then, a first put signal according to the electric charges obtained from the conversion in the first photoelectric conversion layer 22A is output to the signal processor 12 through the electrode 24A1 and the electrode 24A2. The first output signal is an example of the output signal.

Then, radiation LB which is a portion of the radiation L passing through the first photoelectric conversion element 20A is absorbed by the absorption layer 26. Namely, the radiation LB is a radiation L having energy equal to or lower than the threshold value for the absorption layer 26 in the radiation L incident on the photodetector 10A.

On the other hand, radiation LC having passed through the first photoelectric conversion element 20A and the absorption layer 26 reaches the second photoelectric conversion element 202. The radiation LC is a radiation L having energy exceeding the threshold value for the absorption layer 26 in the radiation L incident on the photodetector 10A. The radiation LC that has reached the second photoelectric conversion element 20B is converted into electric charges by the second photoelectric conversion element 20B. Then, a second output signal according to the electric charges obtained from the conversion in the second photoelectric conversion layer 22B is output to the signal processor 12 through the electrode 24B1 and the electrode 24B2. The second output signal is an example the output signal.

Herein, as described above, the absorption layer 26 absorbs the radiation L having energy equal to or lower than the threshold value for the absorption layer 26. For this reason, the second output signal output from the second photoelectric conversion element 20B is an output signal obtained by converting the radiation LC having high energy exceeding the threshold value for the absorption layer 26 into electric charges as compared with the first output signal output from the first photoelectric conversion element 20A.

For this reason, in the photodetector 10A according to the embodiment, in the radiation L incident on the photodetector 10A, the radiation L having energy equal to or lower than the threshold value for the absorption layer 26 is converted into electric charges by the first photoelectric conversion element 20A, and the radiation L having energy exceeding the threshold value for the absorption layer 26 is converted into electric charges by the second photoelectric conversion element 20B.

Herein, a conventional photodetector will be described.

Figure 3:
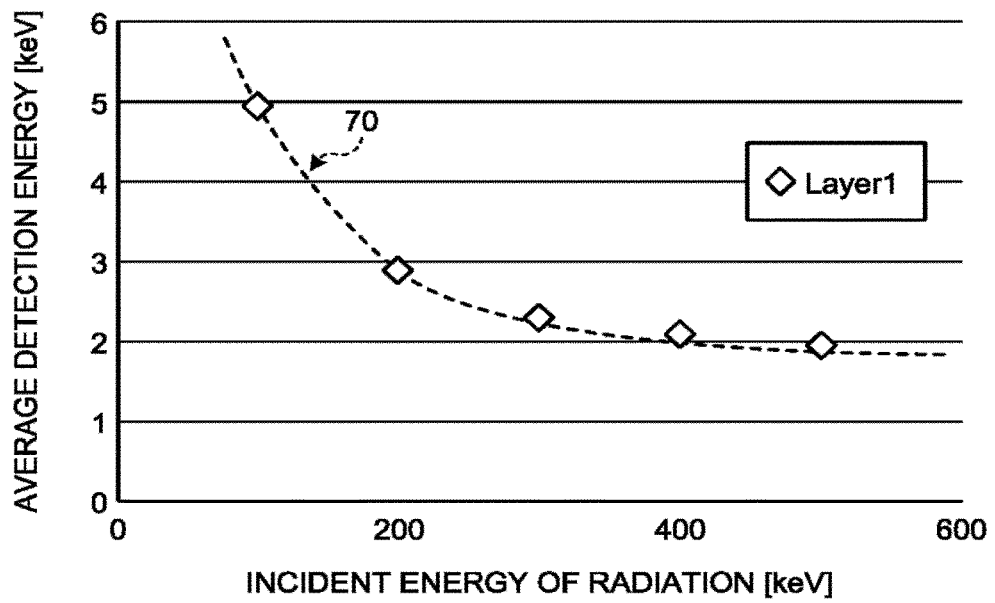
FIG. 3 is a diagram illustrating an example of a detection result by a conventional photodetector.

FIG. 3 is a diagram illustrating an example of a detection result by a conventional photodetector. More specifically, FIG. 3 is a detection result using the conventional photodetector not including the absorption layer 26 and the second photoelectric conversion element 200 in the photodetector 10A (refer to FIG. 2) according to the embodiment. In addition, FIG. 3 is a detection result in a case where an organic photoelectric conversion layer is used for the photoelectric conversion layer (first photoelectric conversion layer 22A) and the thickness is set to 5 μm. A dashed line 70 in FIG. 3 illustrates a relationship between incident energy of the radiation L incident on the photodetector and average detection energy of the radiation L detected by the photodetector.

As illustrated in FIG. 3, in the conventional photodetector, as the incident energy of the incident radiation L increases, the average detection energy becomes smaller. In addition, in the conventional photodetector, as the incident energy of the radiation L increases, the change in the average detection energy becomes smaller, and thus, it is difficult to discriminate the energy. For this reason, in the conventional photodetector, as the incident energy of the radiation L increases, the detection accuracy becomes lower.

Figure 4:
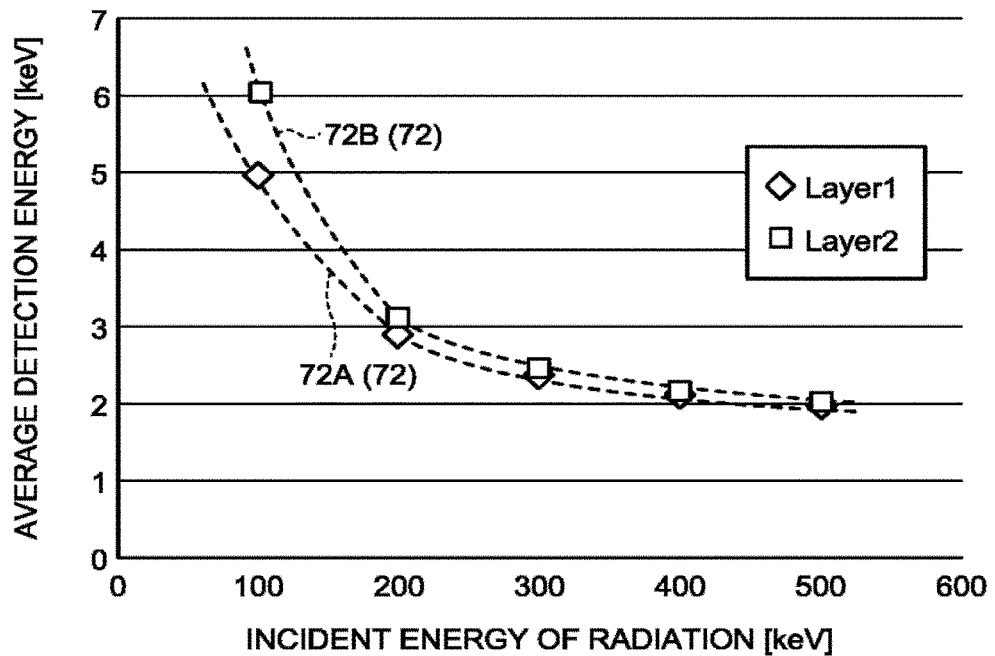
FIG. 4 is a diagram illustrating an example of a detection result by a conventional photodetector.

Therefore, in some cases, a configuration where a plurality of photoelectric conversion elements 20 is stacked may be considered. FIG. 4 is a diagram illustrating examples of detection result by another conventional photodetector. More specifically, FIG. 4 illustrates detection results using the conventional photodetector not including the absorption layer 26 in the photodetector 10A (refer to FIG. 2) according to the embodiment. Namely, FIG. 4 illustrates detection results by a conventional photodetector having a configuration where two photoelectric conversion layers each having a thickness of 5 μm are stacked. Dashed Lines 72 in FIG. 4 illustrate a relationship between the incident energy of the radiation L incident on the photodetector and the average detection energy of the radiation L detected by the photodetector. In addition, a dashed line 72A illustrates the detection result of the photoelectric conversion layer arranged on the up side in the incident direction of the radiation L between the two photoelectric conversion layers. In addition, a dashed line 72B illustrates the detection result of the photoelectric conversion layer arranged on the down side in the incident direction of the radiation L between the two photoelectric conversion layers.

As illustrated in FIG. 4, in the conventional photodetector configured simply by stacking a plurality of photoelectric conversion elements 20, as the incident energy of the incident radiation L increases in any of the plurality of photoelectric conversion layers, the average detection energy becomes smaller. In addition, in the conventional photodetector, as the incident energy of the radiation L increases in any of the plurality of photoelectric conversion layers, the change in the average detection energy becomes smaller, and thus, it is difficult to discriminate the energy. In addition, in the photodetector in the related art, differences between the detected average detection energy among the respective layers of the plurality of photoelectric conversion layers become smaller as the incident energy of the radiation L becomes higher. For this reason, in the conventional photodetector, as the incident energy of the radiation L increases, the detection accuracy becomes lower.

By contrast, the photodetector 10 according to the embodiment is configured to include the absorption layer 26 that absorbs a radiation having energy equal to or lower than the threshold value. The absorption layer 26 is arranged between the first photoelectric conversion element 20A and the second photoelectric conversion element 20B.

For this reason, for example, if the radiation L is incident on the photodetector 10A having the configuration illustrated in FIG. 2, the radiation L having energy equal to or lower than the threshold value for the absorption layer 26 is converted into electric charges by the first photoelectric conversion element 20A and is absorbed by the absorption layer 26. For this reason, the radiation L having energy equal to or lower than the threshold value for the absorption layer 26 does not reach the second photoelectric conversion element 20B. On the other hand, the radiation L having energy exceeding the threshold value for the absorption layer 26, having passed through the first photoelectric conversion element 20A and the absorption layer 26 reaches the second photoelectric conversion element 20B.

For this reason, in the photodetector 10A according to the embodiment, it is also possible to detect the radiation L having high energy exceeding the threshold value for the absorption layer 26, and even in a case where the energy of the incident radiation L is high, it is possible to easily discriminate the energy.

Figure 5:
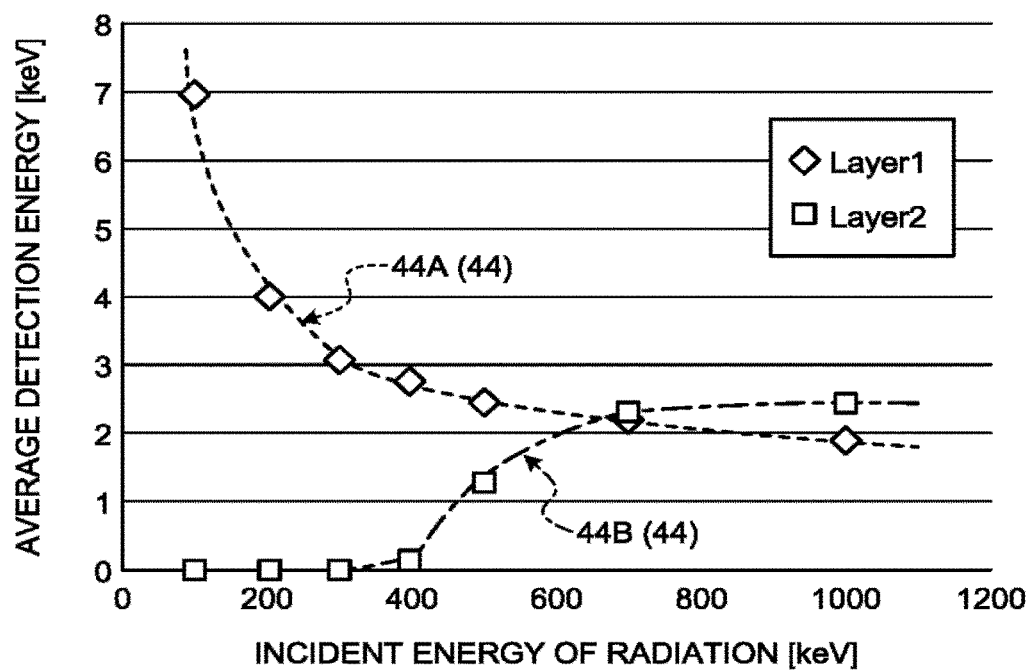
FIG. 5 is a diagram illustrating an example of a detection result of the photodetector according to an embodiment.

FIG. 5 is a diagram illustrating examples of detection results by the photodetector 10 according to the embodiment. More specifically, FIG. 5 illustrates a detection result using the photodetector 10A (refer to FIG. 2) according to the embodiment. The thickness of the first photoelectric conversion layer 22A is set to 5 μm and the thickness of the second photoelectric conversion layer 22B is set to 500 μm. In addition, the absorption layer 26 is adjusted in advance so that the threshold value for the absorption layer 20 is 400 keV.

Dashed lines 44 in FIG. 5 illustrate a relationship between the incident energy of the radiation L incident on the photodetector 10A and the average detection energy of the radiation L detected by the photodetector 10A. A dashed line 44A illustrates a detection result of the first photoelectric conversion element 20A. Namely, the dashed line 44A is a line illustrating a relationship between the incident energy of the radiation L incident on the photodetector 10A and the average detection energy of the radiation L detected by the first photoelectric conversion element 20A. A dashed line 44B illustrates a detection result of the second photoelectric conversion element 20B. Namely, the dashed line 44B is a line illustrating a relationship between the incident energy of the radiation L incident on the photodetector 10A and the average detection energy of the radiation L detected by the second photoelectric conversion element 20B.

As illustrated in the dashed line 44A of FIG. 5, the first photoelectric conversion element 20A can appropriately detect the radiation L having low energy equal to or lower than the threshold value. However, in the first photoelectric conversion element 20A, as the energy of the incident radiation L increases, the change amount of the average detection energy becomes lower, so that it is difficult to discriminate the energy. On the other hand, as illustrated in the dashed line 44B of FIG. 5, in the second photoelectric conversion element 20B, in an energy region where the incident energy of the radiation L incident on the photodetector 10 is large and starts to reach the second photoelectric conversion layer, the change in the average detection energy is particularly large, and the energy discrimination performance is improved.

For this reason, in the photodetector 10A according to the embodiment, it is possible to appropriately detect the energy of the radiation L on both the low energy side and the high energy side with respect to the radiation L incident on the photodetector 10. Namely, even in a case where the energy of the radiation L incident on the photodetector 10A is high, the photodetector 10A according to the embodiment can easily and accurately detect the change (that is, the difference) in the average detection energy with respect to the change in the incident energy of the radiation L. In addition, the low energy denotes energy equal to or lower than the threshold value for the absorption layer 26. The high energy denotes energy exceeding the threshold value for the absorption layer 26.

In the case of the detection result illustrated in FIG. 5, in the photodetector 10A, it is also possible to detect the radiation L having energy exceeding 400 keV.

Therefore, the photodetector 10A according to the embodiment can easily improve the detection accuracy of the radiation L.

Photodetector 10B

In addition, the configuration of the photodetector 10 is not limited to the photodetector 10A illustrated in FIG. 2. For example, in the configuration, the second photoelectric conversion element 20B may also have functions as the substrate 26.

Figure 6:
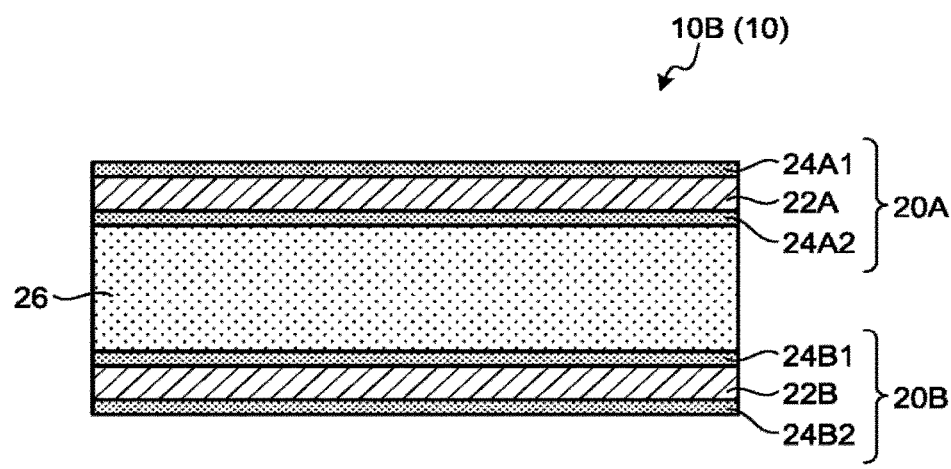
FIG. 6 is a schematic diagram illustrating an example of the photodetector.

FIG. 6 is a schematic diagram illustrating an example of a photodetector 10B. The photodetector 10B is an example of the photodetector 10. The photodetector 10B is a stack in which a second photoelectric conversion element 20B, an absorption layer 26, and a first photoelectric conversion element 20A are stacked in this order. The photodetector 10B has a configuration similar to that of the photodetector 10A (refer to FIG. 2) except that the substrate 28 is not included.

As illustrated in the photodetector 10B, the photodetector 10 may be configured not to include the substrate 28. In this case, in order to implement the second photoelectric conversion element 20B having such a strength as a substrate, in addition to the configuration of the second photoelectric conversion element 20B in the photodetector 10A, at least one of the density, the constituent material, and the thickness may be further adjusted. Accordingly, in the configuration, the second photoelectric conversion element 20B may also have a function of the substrate 28 (refer to FIG. 2).

In the photodetector 10B, since the absorption layer 26 is configured to be arranged between the photoelectric conversion element 20, it is possible to obtain the effects similar to those of the photodetector 10A.

Photodetector 10C

In addition, the absorption layer 26 may be further arranged on the side of the first photoelectric conversion element 20A opposite to the second photoelectric conversion element 20B.

Figure 7:
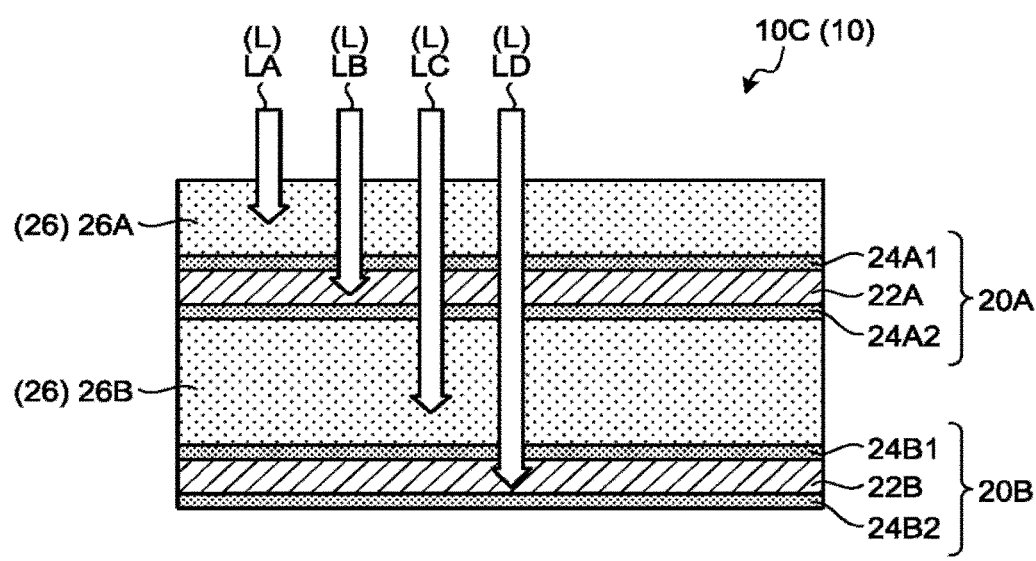
FIG. 7 is a schematic diagram illustrating an example of the photodetector.

FIG. 7 is a schematic diagram illustrating an example of a photodetector 10C. The photodetector 10C is an example of the photodetector 10. The photodetector 10C has a configuration where an absorption layer 26 is further arranged on the first photoelectric conversion element 20A in the photodetector 10B (refer to FIG. 6).

More specifically, the photodetector 10C has a configuration where a second photoelectric conversion element 20E, an absorption layer 26B, a first photoelectric conversion element 20A, and an absorption layer 26A are stacked in this order.

The absorption layer 26A and the absorption layer 26B are examples of the absorption layer 26. The absorption layer 26A is arranged on the side of the first photoelectric conversion element 20A opposite to the second photoelectric conversion element 20B. The absorption layer 26B is arranged between the first photoelectric conversion element 20A and the second photoelectric conversion element 20B.

The configurations of the absorption layer 26A and the absorption layer 26B are similar to that of the absorption layer 26. In addition, the average energy of the radiation L absorbed by the absorption layer 26A is smaller than the average energy of the radiation L absorbed by the absorption layer 26B. In other words, between the absorption layer 26A and the absorption layer 26B, the absorption layer 26 (the absorption layer 26A in the example illustrated in FIG. 7) arranged on the up side in the incident direction of the radiation L absorbs the radiation L having a lower energy than the absorption layer 26 (the absorption layer 26B in the example illustrated in FIG. 7) arranged on the down side of the radiation L. Namely, the absorption layer 26A absorbs the radiation L having energy equal to or lower than a first threshold value. In addition, the absorption layer 26B absorbs the radiation L having energy equal to or lower than a second threshold value. The first threshold value and the second threshold value are examples of the threshold values for the absorption layer 26. In addition, the first threshold value is smaller than the second threshold value.

The radiation L is incident on the photodetector 10C configured in this manner from the first photoelectric conversion element 20A side to the second photoelectric conversion element 20B. The radiation LA, which is a portion of the radiation L having energy equal to or lower than the first threshold value in the radiation L incident on the photodetector 10C, is absorbed by the absorption layer 26A.

Then, the radiation LB having energy exceeding the first threshold value reaches the first photoelectric conversion element 20A and is converted into electric charges by the first photoelectric conversion layer 22A. Furthermore, in the radiation L having passed through the absorption layer 26A and the first photoelectric conversion element 20A, the radiation LC having energy equal to or lower than the second threshold value is absorbed by the absorption layer 26B. Then, radiation LD having energy exceeding the second threshold value reaches the second photoelectric conversion element 202 and is converted into electric charges by the second photoelectric conversion layer 22B.

In the photodetector 10C, since the absorption layer 26 is configured to be arranged between the photoelectric conversion elements 20, it is possible to obtain the effects similar to those of the photodetector 10A.

In addition, the higher the energy of the radiation L incident on the photodetector 10C is, the more effective the configuration of the photodetector 10C is. In addition, the configuration of the photodetector 10C is particularly effective in a case where the type of the radiation L to be detected is beta rays or gamma rays. The higher the energy of beta rays and gamma rays is, the smaller the energy lost per unit length is. For this reason, as compared with other types of radiation L, the larger the incident energy of beta rays and gamma rays is, the smaller the change in the average detection energy (that is, the difference) is, so that it becomes difficult to discriminate energy.

For this reason, in a case where radiation L having high energy is incident on the photodetector 10C or in a case where the type of the radiation L to be detected is beta rays or gamma rays, it is preferable to employ the configuration of the photodetector 10C. By employing the configuration of the photodetector 10C, the energy of the radiation L incident on the first photoelectric conversion element 20A can be reduced to be equal to or lower than the first threshold value for the absorption layer 26A by the absorption layer 26A arranged on the up side of the first photoelectric conversion element 20A in the incident direction of the radiation L. For this reason, in each photoelectric conversion element 20 provided in the photodetector 10C, it is possible to adjust the change (that is, the difference) in the average detection energy with respect to the change in the incident energy to a value easily detectable by each photoelectric conversion element 20.

For this reason, it is possible to further improve the effect of the absorption layer 26B.

Photodetector 10D

In addition, the absorption layer 26 may be further arranged on at least one of the side of the first photoelectric conversion element 20A opposite to the second photoelectric conversion element 20B and the side of the second photoelectric conversion element 20B opposite to the first photoelectric conversion element 20A. In addition, the photodetector 10 may be configured to include three or more photoelectric conversion elements 20.

Figure 8:
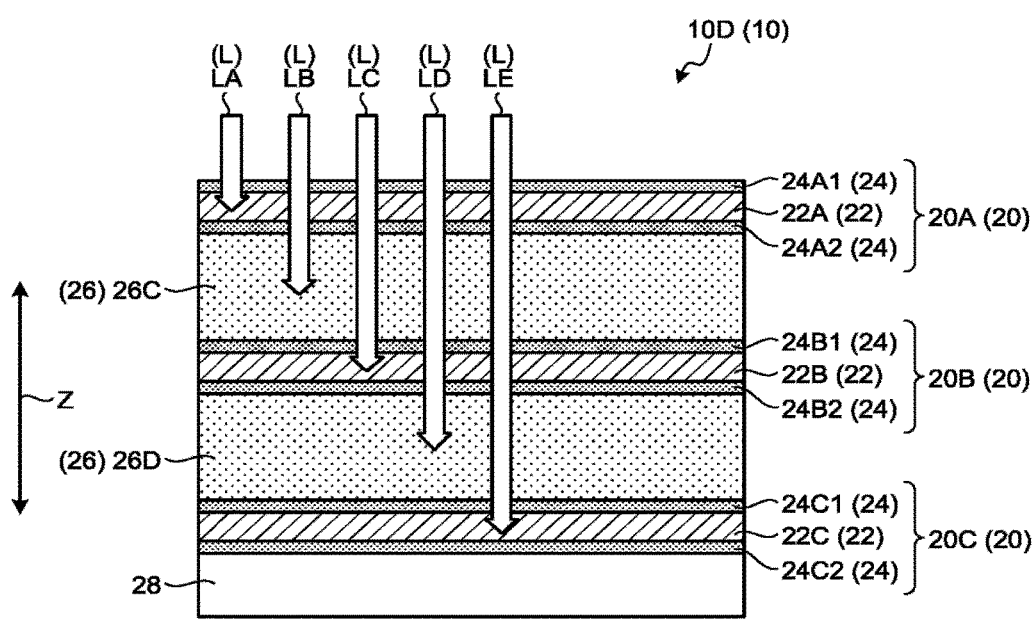
FIG. 8 is a schematic diagram illustrating an example of the photodetector.

FIG. 8 is a schematic diagram illustrating an example of the photodetector 10D. The photodetector 10D is an example of the photodetector 10. The photodetector 100 has a configuration where the photoelectric conversion element 20 and the absorption layer 26 are further arranged between the substrate 28 and the second photoelectric conversion element 20B in the configuration of the photodetector 10A.

More specifically, the photodetector 10D is a stack in which a substrate 28, a third photoelectric conversion element 20C, an absorption layer 26D, a second photoelectric conversion element 20B, an absorption layer 26C, and a first photoelectric conversion element 20A are stacked in this order.

The absorption layer 26C and the absorption layer are examples of the absorption layer 26. The absorption layer 26C is arranged between the first photoelectric conversion element 20A and the second photoelectric conversion element 20B. The absorption layer 26D is arranged between the second photoelectric conversion element 200 and the third photoelectric conversion element 20C.

The configurations of the absorption layer 26C and the absorption layer 260 are similar to that of the absorption layer 26 described above. In addition, the average energy of the radiation L absorbed by the absorption layer 26C is smaller than the average energy of the radiation L absorbed by the absorption layer 26D. In other words, between the absorption layer 26C and the absorption layer 26D, the absorption layer 26 (the absorption layer 26C in the example illustrated in FIG. 8) arranged on the up side in the incident direction of the radiation L absorbs the radiation L having a lower energy than the absorption layer 26 (the absorption layer 26D in the example illustrated in FIG. 8) arranged on the down side of the radiation L. Namely, the absorption layer 26C absorbs radiation L having energy equal to or lower than a third threshold value. In addition, the absorption layer 26D absorbs radiation L having energy equal to or lower than a fourth threshold value. The third threshold value and the fourth threshold value are examples of the threshold value. In addition, the third threshold value is smaller than the fourth threshold value.

The third photoelectric conversion element 20C is an example of the photoelectric conversion element 20. The third photoelectric conversion element 20C has a configuration where the third photoelectric conversion layer 22C is arranged between an electrode 24C1 and an electrode 24C2. Namely, the configuration of the third photoelectric conversion element 20C is similar to those of the first photoelectric conversion element 20A and the second photoelectric conversion element 20B.

The radiation L is incident on the photodetector 100 configured in this manner from the first photoelectric conversion element 20A side to the substrate 28 side. The radiation LA which is a portion of the radiation L incident on the photodetector 10D is converted into electric charges by the first photoelectric conversion layer 22A. Then, in the radiation L having passed through the first photoelectric conversion element 20A, the radiation LB having energy equal to or lower than the third threshold value is absorbed by the absorption layer 26C.

Then, the radiation LC having energy exceeding the third threshold value reaches the second photoelectric conversion element 20B to be converted into electric charges by the second photoelectric conversion layer 22B. Furthermore, in the radiation L having passed through the first photoelectric conversion element 20A, the absorption layer 26C, and the second photoelectric conversion element 20B, the radiation LD having energy equal to or lower than the fourth threshold value is absorbed by the absorption layer 26D. Then, radiation LE having energy exceeding the fourth threshold value reaches the third photoelectric conversion element 20C to be converted into electric charges by the third photoelectric conversion layer 22C.

FIG. 8 illustrates a configuration where the photodetector 10D is configured to include three photoelectric conversion elements 20. However, the photodetector 10D may have a configuration where four or more photoelectric conversion elements 20 are stacked in the stacked direction (direction of arrow Z). In this case, the photodetector may have a configuration where the absorption layer 26 is arranged between each pair of adjacent photoelectric conversion elements 20 in the stacked direction.

In addition, the configurations of the plurality of photoelectric conversion elements 20 provided in the photodetector 10D may be the same or different and may be appropriately adjusted according to the radiation L to be detected. In addition, a portion (for example, thickness) of the plurality of absorption layers 26 provided in the photodetector 10D may be the same or different and may be appropriately adjusted according to the radiation L or the like to be detected.

In addition, in the case of realizing the flexibility and bendability of the photodetector 10, it is preferable to adjust the number of stacked photoelectric conversion elements 20 so as to realize the desired flexibility and bendability.

In the photodetector 10D, since the absorption layer 26 is configured to be arranged between the photoelectric conversion elements 20, it is possible to obtain the effects similar to those of the photodetector 10A.

Photodetector 10E

In addition, the photodetector 10 may be further provided with a scintillator.

Figure 9:
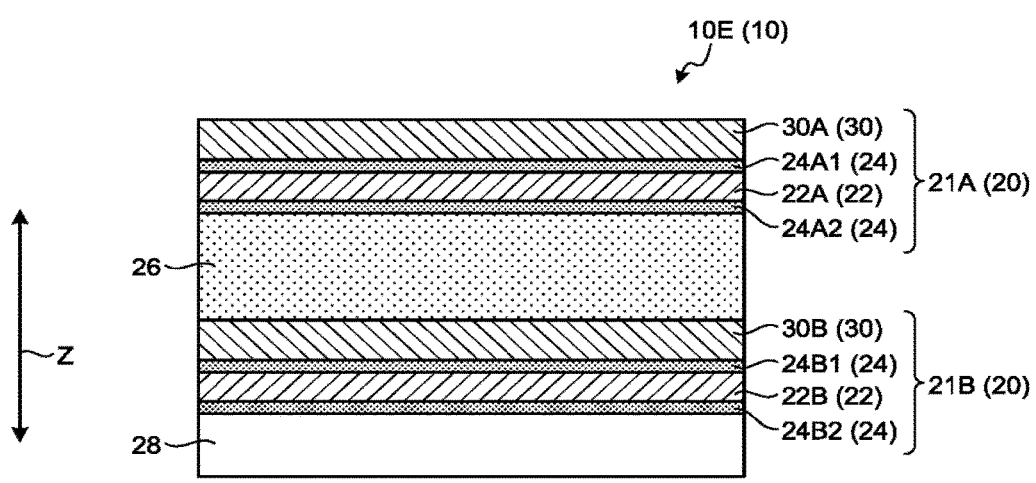
FIG. 9 is a schematic diagram illustrating an example of the photodetector.

FIG. 9 is a schematic diagram illustrating an example of a photodetector 10E. The photodetector 10E is an example of the photodetector 10.

The photodetector 10E is a stack in which a second photoelectric conversion element 21B, an absorption layer 26, and a first photoelectric conversion element 21A are stacked in this order on a substrate 28.

The first photoelectric conversion element 21A is a stack of an electrode 24A2, a first photoelectric conversion layer 22A, an electrode 24A1, and a scintillator 30A. In the example illustrated in FIG. 9, the scintillator 30A is provided on the side of the first photoelectric conversion layer 22A opposite to the absorption layer 26.

In addition, the scintillator 30A may be configured to be provided on the side of the first photoelectric conversion layer 22A close to the absorption layer 26. In this case, the first photoelectric conversion element 21A may have a configuration where the scintillator 50A, the electrode 24A2, the first photoelectric conversion layer 22A, and the electrode 24A1 are stacked in this order.

The second photoelectric conversion element 21B is a stack of an electrode 24B2, a second photoelectric conversion layer 22B, an electrode 24B1, and a scintillator 30B. In the example illustrated in FIG. 9, the scintillator 30B is provided on the absorption layer 26 side in the second photoelectric conversion layer 22B.

The scintillator 30B may be configured to be provided on the side of the second photoelectric conversion layer 22B opposite to the absorption layer 26. In this case, the second photoelectric conversion element 21B may have a configuration where the scintillator 30B, the electrode 24B2, the second photoelectric conversion layer 22B, and the electrode 24B1 are stacked in this order.

The scintillator 30A and the scintillator 30B will be described. In addition, in the description, the scintillator 30A and the scintillator 30B will be collectively referred to as a scintillator 30.

The scintillator 30 converts the radiation L into light having a longer wavelength than the radiation L (scintillation light). The scintillator 30 is made of a scintillator material. The scintillator material emits scintillation light by incident radiation L. The scintillator material is appropriately selected according to the application of the photodetector 10E. The scintillator material is, for example, $Lu_2SiO_5$:(Ce), $LaBr_3$:(Ce), YAP (yttrium aluminum perovskite):Ce, Lu(Y)AP:Ce, a plastic scintillator, or the like, but the scintillator material is not limited thereto.

In addition, at least one of the first photoelectric conversion element 21A and the second photoelectric conversion element 21B may be configured to include the scintillator 30. In a case where one of the first photoelectric conversion element 21A and the second photoelectric conversion element 21B is configured to include the scintillator 30, it is preferable that the first photoelectric conversion element 21A be configured to include the scintillator 30.

In addition, the surface of the scintillator 30 may be covered with a material that reflects photons. In addition, a resin or the like serving as a light guide may be applied between the scintillator 30 and the photoelectric conversion layer 22.

Since the photodetector 10E is configured to include the scintillator 30, the amount of energy corresponding to the scintillation light converted by the scintillator 30 increases to reach each of the first photoelectric conversion layer 22A and the second photoelectric conversion layer 22B. For this reason, the amount of energy of the radiation L detected by each of the first photoelectric conversion layer 22A and the second photoelectric conversion layer 22B can be allowed to be larger than that in the configuration not including the scintillator 30.

For this reason, in the photodetector 10E, it is possible to obtain the effects similar to those of the photodetector 10A, and it is possible to further improve, particularly, the detection accuracy of detection energy in high-energy radiation.

Photodetector 10F

In addition, the absorption layer 26 in the photodetector 10 may be configured with plurality of regions E.

Figure 10:
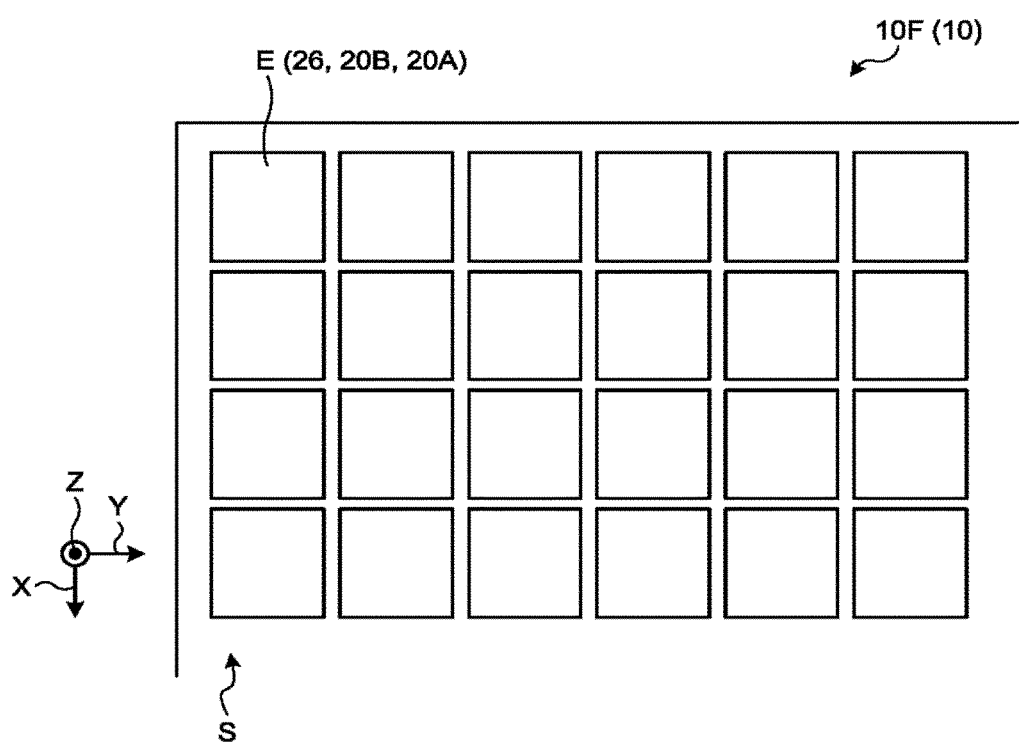
FIG. 10 is a schematic diagram illustrating an example of the photodetector.

FIG. 10 is a schematic diagram illustrating an example of a photodetector 10F. The photodetector 10F is an example of the photodetector 10.

Similarly to the photodetector 10A illustrated in FIG. 2, the photodetector 10F is a stack in which a second photoelectric conversion element 20B, an absorption layer 26, and a first photoelectric conversion element 20A are stacked in this order on a substrate 28.

In the photodetector 10F, the absorption layer 26 is divided into a plurality of regions E parallel to the light receiving surface S.

The light receiving surface S is a plane perpendicular to the stacked direction (direction of arrow of the photodetector 10F in the photodetector 10F. In other words, the light receiving surface S is an XY plane formed by two mutually perpendicular directions (X direction and Y direction) perpendicular to the stacked direction (direction of arrow of the photodetector 10F.

The region E may be a pixel area corresponding to one pixel. In addition, the region E may be a region corresponding to a plurality of pixels.

In addition, it is preferable that the first photoelectric conversion element 20A and the second photoelectric conversion element 20B be arranged corresponding to the respective regions E. Namely, it is preferable that the photodetector 10F have a configuration including a stack of the second photoelectric conversion element 20B, the absorption layer 26, and the first photoelectric conversion element 20A for each region E.

In this case, by arranging the electrode 24 for each region E, it is possible to read an output signal for each region E. For this reason, the photodetector 10F can also be used as a detector for detecting the incident position of the radiation L. In addition, in this case, as compared with a case where the photodetector 10 is not configured with a plurality of regions E, the inter-terminal capacitance between the regions E is reduced, so that it is also possible to reduce amplifier noise.

In addition, in the photodetector 10F, since the absorption layer 26 is configured to be arranged between the photoelectric conversion elements 20, it is possible to obtain the effects similar to those of the photodetector 10A.

Photodetector 10G, Photodetector 10H, and Photodetector 10I

The configuration of the absorption layer 26 between a plurality of regions E may be the same or different. More specifically, the absorption layer 26 of the photodetector 10 may be configured with a plurality of regions E of which at least one of thickness, constituent material, and density along the light receiving surface S is different.

The configuration of the absorption layer 26 being the same denotes that the thickness, the constituent material, and the density are all the same. The configuration of the absorption layer 26 being different denotes that at least one of the thickness, the constituent material, and the density is different.

Figure 11:
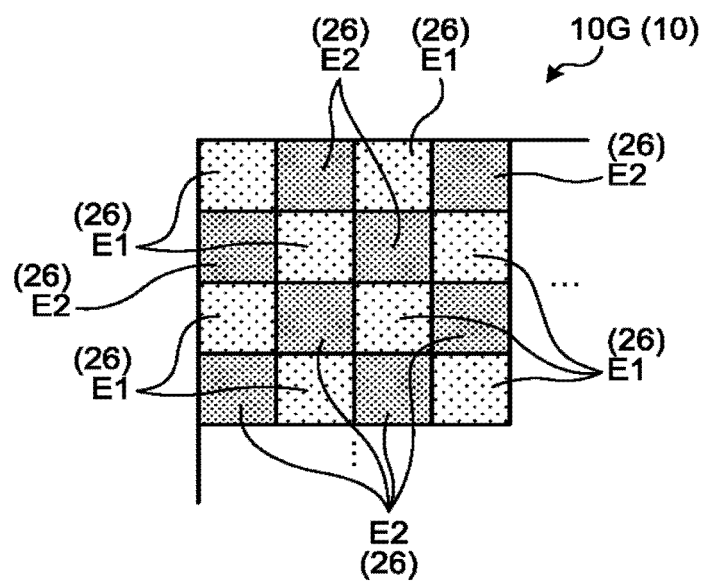
FIG. 11 is a schematic diagram illustrating an example of a photodetector.
Figure 12:
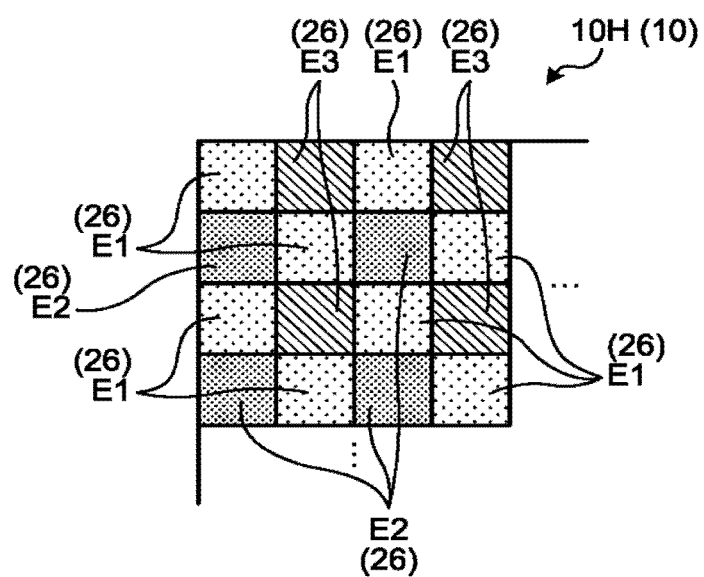
FIG. 12 is a schematic diagram illustrating an example of the photodetector.
Figure 13:
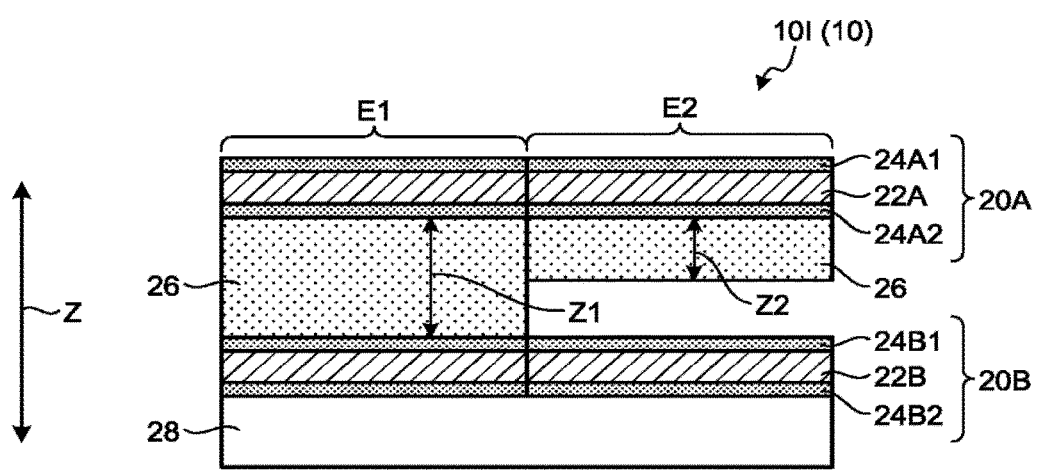
FIG. 13 is a schematic diagram illustrating an example of the photodetector.

FIGS. 11 to 13 illustrate a photodetector 10G, a photodetector 10H, and a photodetector 10I as examples of the photodetector 10.

FIG. 11 is a schematic diagram illustrating an example of the photodetector 10G. In the photodetector 10G, two types of configurations are prepared as the absorption layers 26 in the photodetector 10G. The photodetector 10G is an example where the regions E (region E1 and region E2) of the respective types of the absorption layers 26 are alternately arranged along the light receiving surface S.

FIG. 12 is a schematic diagram illustrating an example of the photodetector 10H. In the photodetector 10H, three types of configurations were prepared as the absorption layers 26 in the photodetector 10H. The photodetector 10H is an example where the regions E (region E1, region E2, and region E3) of the respective types of absorption layers 26 are alternately arranged along the light receiving surface S. Namely, in the photodetector 10H, a plurality of regions E are arranged in a Bayer pattern.

FIG. 13 is a schematic diagram illustrating an example of the photodetector 10I. The photodetector 10I is prepared to be configured with two types of the absorption layers 26 having different thicknesses. Then, the photodetector 10I is an example where regions E (region E1 and region E2) of the absorption layers 26 having different thicknesses are alternately arranged along the light receiving surface FIG. 13 illustrates an example where the thickness of the absorption layer 26 corresponding to the region E1 is set to the thickness Z1 and the thickness of the absorption layer 26 corresponding to the region E2 is set to the thickness 22.

In this manner, by configuring the absorption layers 26 to include the plurality of regions E having at least different one of the thickness, the constituent material, and the density along the light receiving surface S of the radiation L, it is possible to adjust at least one of the type of the radiation L to be absorbed by the absorption layers 26, the threshold value for the absorption layers 26, and the desired photoelectric conversion efficiency for each region E having a different configuration.

In addition, as illustrated in FIGS. 10 to 12, by arranging the plurality of regions E in a two-dimensional lattice pattern along the light receiving surface S, it is possible to suppress position dependency of the detection accuracy in the photodetector 10 which disperses depending on the position of the region E.

In addition, in the photodetector 10G, the photodetector 10H, and the photodetector 10I, since the absorption layer 26 is configured to be arranged between the photoelectric conversion elements 20, it possible to obtain the effects similar to those of the photodetector 10A.

Photodetector 10J to Photodetector 10M

In addition, it is preferable that the photodetector 10 be configured to have flexibility and bendability. By using the absorption layer 26 for the photodetector 10, at least one of the number of photoelectric conversion layers 22 to be stacked and the thickness of the photoelectric conversion layer 22 is configured to be smaller (thinner), so that it is possible to realize the photodetector 10 having flexibility and bendability.

Then, by adjusting at least one of the constituent material, the thickness, and the density of the absorption layer 26, the first photoelectric conversion element 20A, the second photoelectric conversion element 20B, and the substrate 28 in the photodetector 10, it is possible to achieve the photodetector 10 having the desired flexibility and bendability.

For example, a non-conducting plastic substrate or the like may be used for the absorption layer 26.

FIGS. 14A to 14D are schematic diagrams illustrating an example of the photodetector 10 in a bent state.

Figure 14A:
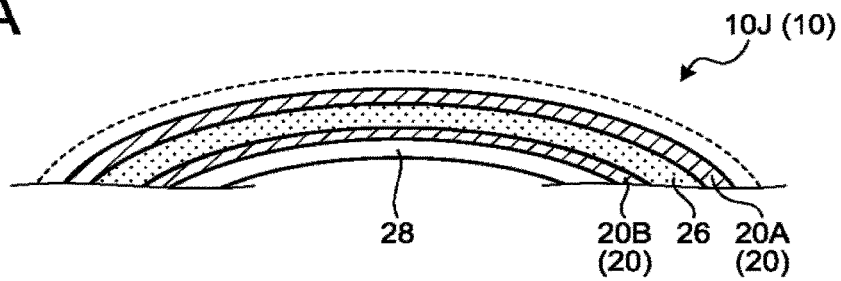
FIGS. 14A to 14D are schematic diagrams illustrating an example of the photodetector.

FIG. 14A is a schematic diagram illustrating an example of the photodetector 10J. The photodetector 10J is an example of the photodetector 10. The configuration of the photodetector 10J is similar to that of the photodetector 10A (refer to FIG. 2).

As illustrated in FIG. 14A, the photodetector 10J can be provided in a device to be applied or the like in a bent state.

Figure 14B:
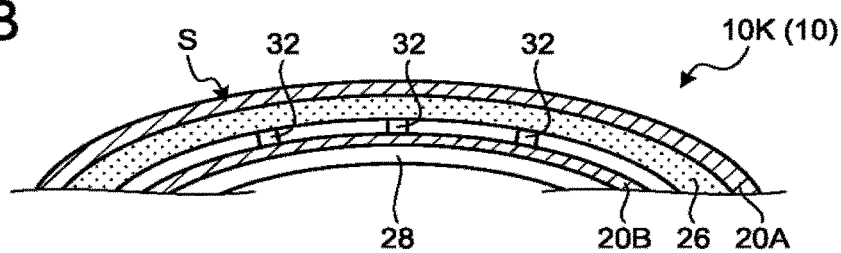

FIG. 14B is a schematic diagram illustrating an example of the photodetector 10K. The photodetector 10K is an example of the photodetector 10. The configuration of the photodetector 10K is similar to that of the photodetector 10A (refer to FIG. However, the photodetector 10K has a configuration where a plurality of spacers 32 are arranged between the second photoelectric conversion element 20B and the absorption layer 26. The spacers 32 are arranged to be separated at a predetermined interval along the light receiving surface S of the photodetector 10K. The spacers 32 retain the interval between the absorption layer 26 and the second photoelectric conversion element 20B.

For this reason, even in a case where the photodetector 10K is bent, the spacing between the absorption layer 26 and the second photoelectric conversion element 20B is maintained uniform along the light receiving surface S. For this reason, even in a case where the photodetector 10K is bent, the thickness of the absorption layer 26 and the photoelectric conversion element 20 along the light receiving surface S can be maintained uniform.

In addition, the configuration of FIG. 14B is particularly effective in a case where the type of the radiation L to be detected is beta rays.

Beta rays are easy to attenuate because the flight range in air is not as long as gamma rays. For this reason, in a case where the type of the radiation L is beta rays, if it is desired to measure a surface dose on a certain light receiving surface S, it is preferable to detect the beta rays at the same distance from the curved surface of the light receiving surface S. For this reason, by the configuration of FIG. 14B, it is possible to maintain the thickness of the photoelectric conversion element 20 and the thickness of the absorption layer 26 uniform along the curved surface of the light receiving surface S, so that it is possible to accurately detect the beta rays.

The spacer 32 may be arranged in at least one of regions between the first photoelectric conversion element 20A and the absorption layer 26, between the absorption layer 26 and the second photoelectric conversion element 20B, and between the second photoelectric conversion element 20B and the substrate 28.

Figure 14C:
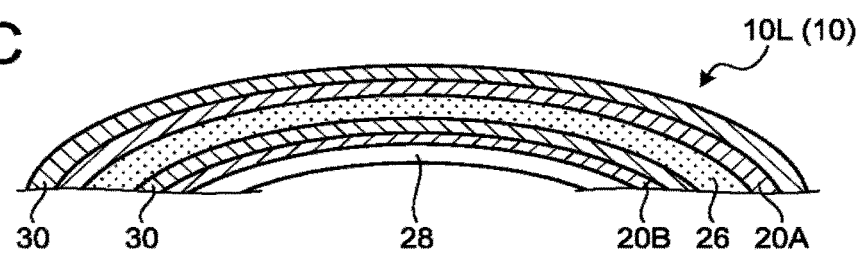

FIG. 14C is a schematic diagram illustrating an example of the photodetector 10L including the scintillator 30. The photodetector 10L is an example of the photodetector 10. The configuration of the photodetector 10L is similar to that of the photodetector 10E (refer to FIG. 9).

Similarly to the photodetector 10J, even the photodetector 10L including the scintillator 30 can be provided in a device to which the photodetector 10L is applied in a bent state. In this case, as the constituent material of the scintillator 30, a constituent material that can withstand the bending may be selected. For example, as a constituent material of the scintillator 30, a thin plastic scintillator may be used.

Figure 14D:
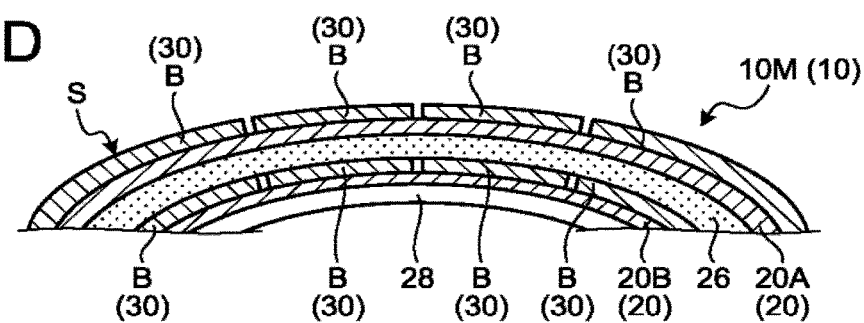

FIG. 14D is a schematic diagram illustrating an example of the photodetector 10M provided with the scintillator 30. The photodetector 10M is an example of the photodetector 10. The configuration of the photodetector 10M is similar to that of the photodetector 10B (refer to FIG. 9).

As illustrated in FIG. 14D, the scintillator 30 provided in e photodetector 10M may be configured to be divided into a plurality of blocks B instead of being configured as a single piece along the light receiving surface S. By configuring the scintillator 30 to be divided into a plurality of blocks B, bending easiness can be realized for the photodetector 10M including the scintillator 30.

In addition, in the photodetectors 10J to 10M, since the absorption layer 26 is configured to be arranged between the photoelectric conversion elements 20, it is possible to obtain the effects similar to those of the photodetector 10A.

Signal Processor 12

Returning to FIG. 1, the description will be continued. Next, the signal processor 12 will be described.

As described above, the signal processor 12 is electrically connected to the photodetector 10, the storage 14, the communication unit 16, and the display 18.

In addition, a case where the photodetector 10 is the photodetector 10A (refer to FIG. 2) is described as an example. However, in a case where the photodetector 10 is any one of the photodetector 10B to the photodetector 10M, the signal processor 12 may perform the similar processes.

The signal processor 12 receives the first output signal from the first photoelectric conversion element 20A. In addition, the signal processor 12 receives the second output signal from the second photoelectric conversion element 20B.

The first output signal is a signal indicating the electric charges obtained from the conversion in the first photoelectric conversion layer 22A. In other words, the first output signal is the average detection energy of the radiation L detected by the first photoelectric conversion layer 22A. The signal processor 12 converts the charge amount of the electric charges detected by the first photoelectric conversion layer 22A into a signal that can be measured by a charge amplifier or the like and further converts the charge amount into the first output signal by performing A/D conversion. In addition, in the embodiment, in order to simplify the description, it is assumed that the signal processor 12 receives the first output signal from the first photoelectric conversion layer 22A.

The second output signal is a signal indicating the electric charges obtained from the conversion in the second photoelectric conversion layer 22B. In other words, the second output signal is the average detection energy of the radiation L detected by the second photoelectric conversion layer 22B. The signal processor 12 converts the charge amount of the electric charges detected by the second photoelectric conversion layer 22B into a signal that can be measured by a charge amplifier or the like and further converts the charge amount into the second output signal by performing A/D conversion. In addition, in the embodiment, in order to simplify the description, it is assumed that the signal processor 12 receives the second output signal from the second photoelectric conversion layer 22B.

Herein, as described above, the absorption layer 26 absorbs the radiation L having energy equal to or lower than the threshold value. For this reason, the second output signal output from the second photoelectric conversion element 20B is an output signal obtained by converting the radiation L having high energy exceeding the threshold value for the absorption layer 26 into electric charges as compared with the first output signal output from the first photoelectric conversion element 20A.

The signal processor 12 specifies the detection energy of the radiation L by using the first output signal and the second output signal. Namely, the signal processor 12 specifies the detection energy of the radiation L by using the first output signal and the second output signal, which are output signals obtained by converting the radiation L having different energy into electric charges.

More specifically, the signal processor 12 specifies the detection energy of the radiation L by using the first output signal output from the first photoelectric conversion element 20A and the second output signal output from the second photoelectric conversion element 20B.

More specifically, the signal processor 12 is configured to include a calculator 12A, a discriminator 12B, and an output controller 12C. The calculator 12A, the discriminator 12B, and the output controller 12C are realized, for example, by one or more processors. For example, each of the units may be realized by causing a processor such as a central processing unit. (CPU) to execute a program, that is, by software. Each of the units may be realized by a processor such as a dedicated integrated circuit (IC), that is, by hardware. Each of the units may be realized by using software and hardware in combination. In the case of using a plurality of processors, each processor may realize one of the units or may realize two or more of the units.

The calculator 12A calculates a signal ratio of the first output signal and the second output signal as an evaluation value of the radiation incident on the photodetector 10. More specifically, the signal ratio is a value obtained by dividing the second output signal by the first output signal. Namely, the evaluation value can be expressed by the following Equation (1).

Evaluation Value=Second Output Signal/First Output Signal    (1)

The first output signal is an output signal according to the electric charges obtained from the conversion in the first photoelectric conversion element 20A. The second output signal is an output signal according to the electric charges obtained from the conversion in the second photoelectric conversion element 20B. The output signal corresponds to the average detection energy (refer to FIG. 5).

More specifically, the calculator 12A calculates the average detection energy in each of the first photoelectric conversion element 20A and the second photoelectric conversion element 20B as a first output signal and a second output signal at predetermined time intervals. Then, the calculator 12A calculates an evaluation value which is a value obtained by dividing the second output signal by the first output signal.

In a case where the calculation method is used, the variation of the evaluation value when the radiation L starts to reach the second photoelectric conversion element 20E becomes large, and thus, there is an advantage in that the change (that is, the difference) in the average detection energy with respect to the change in the incident energy of the radiation L is easy to detect.

For example, in a case where the photodetector 10A illustrates the detection result illustrated in FIG. 5, in the region having incident energy exceeding 400 keV, the change amount of the average detection energy with respect to the change in incident energy becomes large. For this reason, the calculator 12A can calculate the evaluation value more accurately than the cases of using the output signal from the conventional photodetector that does not include the absorption layer 26.

The specifier 12B specifies the detection energy of the radiation L by using the evaluation value calculated by the calculator 12A and the conversion table stored in the storage 14.

The conversion table is stored in advance in the storage 14. The storage 14 stores in advance a first conversion table 14A and a second conversion table 14B as conversion tables. The storage 14 may store in advance at least the first conversion table 14A.

The first conversion table 14A is a conversion table where the evaluation value and the incident energy of the radiation L are in correspondence to each other.

Figure 15:
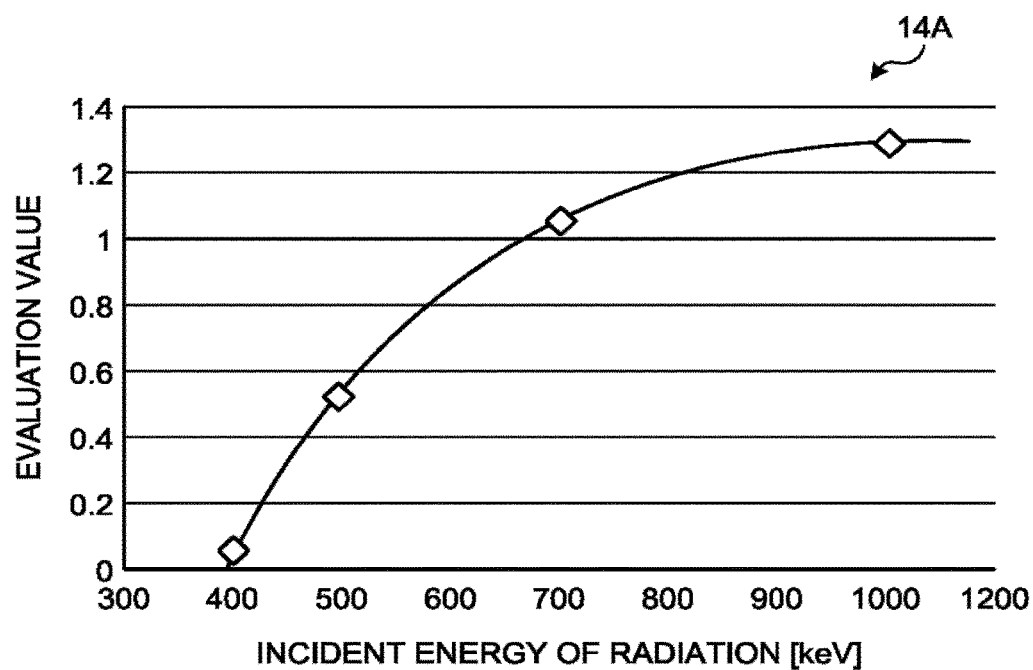
FIG. 15 is a diagram illustrating an example of a first conversion table.

FIG. 15 illustrates an example of the first conversion table 14A. For example, by using the photodetector 10 (for example, the photodetector 10A) used for detection, the signal processor 12 measures in advance the incident energy of the radiation L incident on the photodetector 10 and the evaluation value which is a signal ratio between the first output signal and the second output signal output from the photodetector 10. Then, the signal processor 12 generates in advance the first conversion table 14A representing the relationship between the incident energy of the radiation L and the evaluation value, which is the measurement result.

In addition, the signal processor 12 may generate in advance the first conversion table 14A by simulation. In addition, the signal processor 12 may generate in advance the first conversion table 14A by using Monte Carlo simulation or the like at the time of activation or calibration of the detection device 1000.

In addition, the first conversion table 14A may be generated by an external device or the like. Then, the storage 14 stores in advance the first conversion table 14A.

The first conversion table 14A may be stored in advance in an external device or the like. Then, the specifier 12B may specify the detection energy of the radiation L by reading the first conversion table 14A from the external device. In addition, the specifier 12B may specify the detection energy by outputting the evaluation value calculated by the calculator 12A to the external device and acquiring the detection energy of the radiation L from the external device. In this case, the external device may read the detection energy corresponding to the evaluation value received from the specifier 12B from the first conversion table 14A and transmit the detection energy to the detection device 1000.

In addition, tree first conversion table 14A may be any table illustrating the relationship between the incident energy of the radiation L incident on the photodetector 10 and the evaluation value and may be any one of a table, a function, a diagram, and a database.

Returning to FIG. 1, the description continues to be made. The signal processor 12 may generate in advance the first conversion table 14A for each type of the radiation L to be detected and store the first conversion table 14A in the storage 14.

For example, the first conversion table 14A corresponding to each of beta rays, gamma rays, and heavy particle rays may be generated in advance and stored in the storage 14. In this case, at the time of generating the first conversion table 14A, each type of the radiation d may be emitted to the photodetector 10 to measure in advance the relationship between the incident energy of the type of the radiation L and the evaluation value. Therefore, the signal processor 12 may generate in advance the first conversion table 14A for each type of the radiation L and store the first conversion table 14A in advance in the storage 14.

In addition, in some cases, the energy of the radiation L incident on the photodetector 10 may be equal to or lower than the threshold value for the absorption layer 26. In such a case, the radiation L may not reach the second photoelectric conversion element 20B.

Therefore, in the embodiment, the storage 14 stores in advance the second conversion table 14B. The second conversion table 14B is a conversion table where the first output signal from the first photoelectric conversion element 20A and the incident energy of the radiation L are in correspondence to each other.

For example, the radiation L having energy lower than the threshold value for the absorption layer 26 is emitted to the photodetector 10 (for example, the photodetector 10A) used for detection. Then, the relationship between the first output signal output from the first photoelectric conversion element 20A of the photodetector 10 and the energy of the radiation L emitted to the photodetector 10 is measured in advance. Then, the signal processor 12 may generate in advance the second conversion table 14B by using the measurement result and store in advance the second conversion table 14B in the storage 14.

In addition, the second conversion table 14B may be generated by an external device or the like. Then, the storage 14 stores in advance the second conversion table 14B.

In addition, similarly, with respect to the second conversion table 14B, the second conversion table 14B may be generated in advance for each type of the radiation L to be detected and stored in the storage 14.

The specifier 12B specifies the incident energy corresponding to the evaluation value calculated by the calculator 12A in the first conversion table 14A as the detection energy of the radiation L detected by the photodetector 10.

In a case where the radiation L incident on the photoelectric conversion element 20 (the first photoelectric conversion element 20A and the second photoelectric conversion element 20B) loses energy in the photoelectric conversion layer 22 of the photoelectric conversion element 20, the amount of electric charges generated in the photoelectric conversion layer 22 is proportional to the energy of the radiation L incident on the photoelectric conversion layer 22. For this reason, it is possible to specify the detection energy detected by the photodetector 10A of the radiation L incident on the photodetector 10 by using the evaluation value calculated by the calculator 12A and the first conversion table 14A.

In addition, the specifier 12B can specify the detection energy detected by the photodetector 10A of the radiation L to be specified by using the first conversion table 14A corresponding to the type of the radiation L to be specified.

The specifier 12B may specify the detection energy of any type of the radiation L. It is particularly preferable that the specifier 12B specify the detection energy of beta rays. In this case, the specifier 12B may specify the detection energy of the beta rays by using the first conversion table 14A corresponding to the beta rays as the type of the radiation L.

Figure 16:
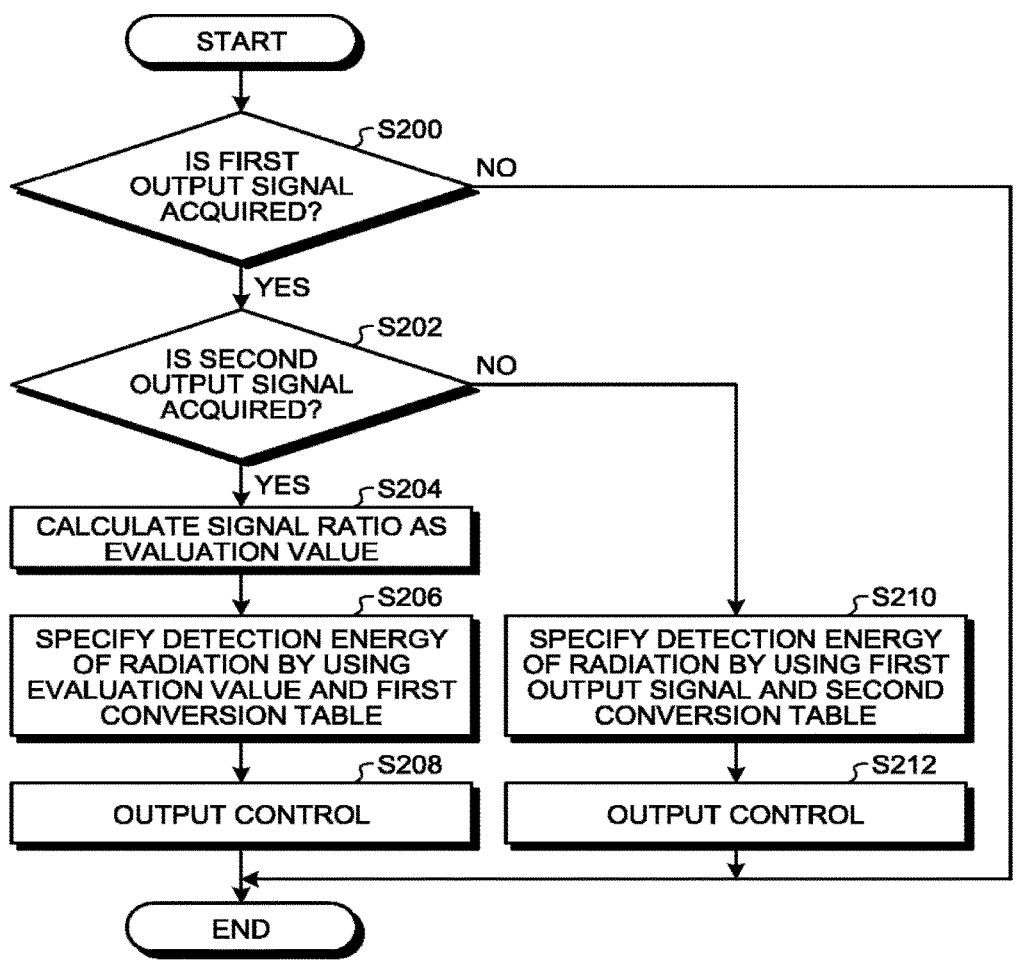
FIG. 16 is a flowchart illustrating an example of a procedure of information processing.

Next, an example of a procedure of information processing executed by the signal processor 12 drill be described. FIG. 16 is a flowchart illustrating the example of the procedure of information processing executed by the signal processor 12. In addition, in FIG. 16, a case where the photodetector 10A is used as the photodetector 10 is illustrated as an example.

First, the calculator 12A determines whether or not the first output signal is acquired from the first photoelectric conversion element 20A of the photodetector 10A (Step 200). If a negative determination is made in Step S200 (Step S200: No), this routine is ended. If an affirmative determination is made in Step S200 (Step S200: Yes), the process proceeds to Step S202.

In Step S202, the calculator 12A determines whether or not the second output signal is acquired from the second photoelectric conversion element 20B of the photodetector 10A (Step S202).

If an affirmative determination is made in Step S202 (Step S202: Yes), the process proceeds to Step S204. In Step S204, the signal ratio of the first output signal acquired in Step S200 and the second output signal acquired in Step S202 is calculated as an evaluation value (Step S204).

Next, the specifier 12B specifies the detection energy of the radiation L by using the evaluation value calculated in Step S204 and the first conversion table 14A. (Step S206).

For example, the specifier 12B specifies the type of the radiation L to be detected. The type of the radiation L to be detected may be accepted from the external device through the communication unit 16 or may be accepted from the input unit operated by a user.

Then, the specifier 125 reads the first conversion table 14A corresponding to the specified type of the radiation L from the storage 14. For example, the specifier 12B reads the first conversion table 14A corresponding to beta rays from the storage 14. Then, the specifier 12B reads the incident energy of the radiation L corresponding to the evaluation value calculated in Step S204 in the read first conversion table 14A. Then, the specifier 12B specifies the read incident energy as the detection energy of the radiation L (for example, beta rays) detected by the photodetector 10.

Next, the output controller 12C controls outputting of the information indicating the specification result specified in Step S206 to the communication unit 16 and the display 18 (Step S208). By the process of Step S208, the information indicating the specification result is transmitted from the communication unit 16 to the external device. In addition, by the process of Step S208, the information indicating the specification result is displayed on the display 18. Then, the routine is ended.

On the other hand, if a negative determination is made in Step S202 (Step S202: No), the process proceeds to Step S210. In Step S210, the specifier 12B specifies the detection energy of the radiation L by using the first output signal acquired in Step S200 and the second conversion table 14B (Step S210). For example, the specifier 12B specifies the incident energy of the radiation L corresponding to the first output signal acquired in Step S200 in the second conversion table 14B as the detection energy of the radiation L detected by the photodetector 10.

Then, the output controller 125 controls outputting of the information indicating the specification result specified in Step S210 to the communication unit 16 and the display 18 (Step S212). By the process of Step S212, the information indicating the specification result is transmitted from the communication unit 16 to the external device. In addition, by the process of Step S212, the information indicating the specification result is displayed on the display 18. Then, the routine is ended.

As described above, the photodetector 10 according to the embodiment is configured to include the first photoelectric conversion element 20A, the second photoelectric conversion element 20B, and the absorption layer 26. The first photoelectric conversion element 20A is configured to include the first photoelectric conversion layer 22A. The first photoelectric conversion layer 22A converts the energy of the radiation L into electric charges. The second photoelectric conversion element 20B is configured to include the second photoelectric conversion layer 22B. The second photoelectric conversion layer 22B converts the energy of the radiation L into electric charges. The absorption layer 26 is arranged between the first photoelectric conversion element 20A and the second photoelectric conversion element 20B and absorbs the radiation L having energy equal to or lower than the threshold value.

For this reason, the radiation L having energy exceeding the threshold value for the absorption layer 26, which has not been converted into electric charges by the first photoelectric conversion element 20A and has passed through the first photoelectric conversion element 20A and the absorption layer 26, is effectively converted into electric charges by the second photoelectric conversion element 20B. In addition, the radiation L having energy exceeding the threshold value for the absorption layer 26 selectively reaches the second photoelectric conversion element 20B. In addition, as described with reference to FIG. 5, by using the electric charges obtained from the conversion in the second photoelectric conversion element 20B, it is also possible to accurately discriminate the high-energy radiation L exceeding the threshold value for the absorption layer 26.

Therefore, even in a case where the energy of the radiation L incident on the photodetector 10 is high, the photodetector 10 according to the embodiment can easily and accurately detect the change (that is, the difference) in the average detection energy with respect to the change in the incident energy of the radiation L, so that it is possible to easily perform the energy discrimination.

Therefore, the photodetector 10 according to the embodiment can easily improve the detection accuracy of the radiation L.

In addition, the detection device 1000 according to the embodiment is configured to include a photodetector 10, a calculator 12A, and a specifier 12B. The calculator 12A calculates a signal ratio of the first output signal according to the electric charges obtained from the conversion in the first photoelectric conversion element and the second output signal according to the electric charges obtained from the conversion in the second photoelectric conversion element 20B as an evaluation value of the incident radiation L. The specifier 125 specifies the incident energy corresponding to the calculated evaluation value in the first conversion table 14A where the evaluation value and the incident energy of the radiation L are in correspondence to each other as the detection energy of the radiation L.

As described above, the photodetector 10 easily and accurately detects the change (that is, the difference) in the average detection energy with respect to the change in the incident energy of the radiation L with respect to the radiation L having a wide range of energy ranging from low energy to high energy. Then, the detection device 1000 specifies the detection energy of the radiation L by using the accurately detected output signal (first output signal and second output signal).

Therefore, the detection device 1000 according to the embodiment can easily improve the detection accuracy of the radiation L.

In addition, in some cases, as illustrated in FIGS. 10 to 13, the photodetectors 10B to 10I where the absorption layer 26 is configured with a plurality of regions E along the light receiving surface S may be used as the photodetector 10. In this case, the signal processor 12 of the detection device 1000 may calculate the evaluation value and specify the detection energy for each type of region E.

Therefore, the detection device 1000 can specify the detection energy corresponding to each type of region F corresponding to the type of the radiation L.

In addition, as described above, it is preferable that the type of the radiation L to be detected by the detection device 1000 be beta rays.

The beta rays have the characteristic that the energy lost per unit length decreases as the energy increases. For this reason, in the case of the configuration not including the absorption layer 26, the detection accuracy of high-energy beta rays is particularly much lower than the detection accuracy of beta rays having low energy.

In addition, as the energy of beta rays is higher, penetration easiness of the photoelectric conversion layer 22 becomes more prominent. For this reason, as described with reference to FIG. 4, in the related art, in order to detect high-energy beta rays, it is necessary to stack the number of layers of the photoelectric conversion elements 20 according to the energy intensity of the beta rays to be detected. For this reason, in the related art, the sire of the photodetector is increased, the flexibility and the bendability are lowered, and it is difficult to easily improve the detection accuracy of the radiation.

On the other hand, in the embodiment, the photodetector 10 has a configuration where the absorption layer 26 is arranged between the first photoelectric conversion element 20A and the second photoelectric conversion element 20B. In addition, the specifier 12B specifies the detection energy of the beta rays by using the evaluation value calculated by the calculator 12A and the first conversion table 14A corresponding to the beta rays.

For this reason, in the detection device 1000 according to the embodiment, with respect to both energy ranges of the energy equal to or lower than the threshold value for the absorption layer 26 incident on the photodetector 10 and the energy exceeding the threshold value for the absorption layer 26 incident on the photodetector 10, it is possible to easily specify the detection energy of beta rays at a high accuracy.

Hardware Configuration

Figure 17:
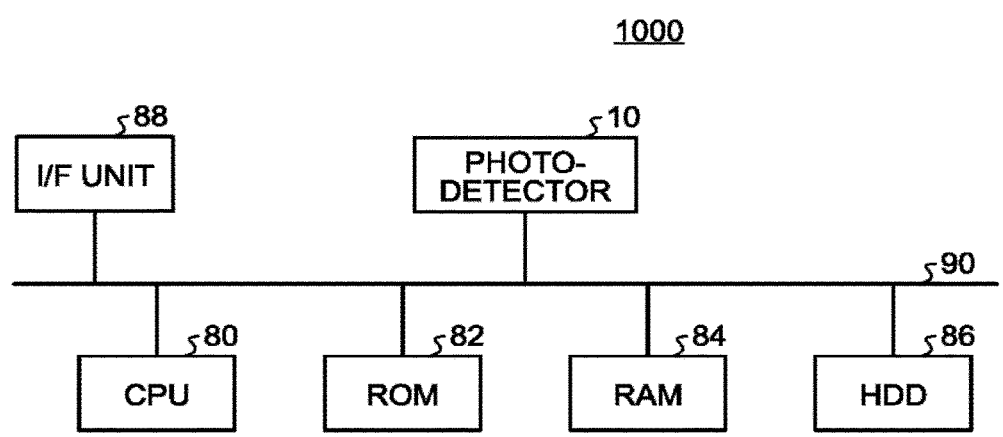
FIG. 17 is a block diagram illustrating an example of a hardware configuration.

Next, a hardware configuration of the detection device 1000 according to the above embodiment will be described. FIG. 17 is a block diagram illustrating a hardware configuration example of the detection device 1000 according to the above embodiment.

The detection device 1000 according to the above embodiment has a hardware configuration using a general computer where a CPU 80, a read only memory (ROM) 82, a random access memory (RAM) 84, a hard disk drive (HDD) 66, an I/F unit 86, and a photodetector 10 are connected to each other via a bus 90.

The CPU 80 is an arithmetic unit that controls the entire processes of the detection device 1000. The RAM 84 stores data necessary for various processes by the CPU 80. The ROM 82 stores programs and the like for implementing various processes by the CPU 80. The HDD 86 stores the data stored in the above-described storage 14. The I/F unit 88 is an interface for connecting to an external device or an external terminal via a communication line or the like and transmitting/receiving data to/from the external device or the external terminal connected thereto.

A program for executing the above processes executed by the detection device 1000 according to the above embodiment is provided by being incorporated into the ROM 82 or the like in advance.

In addition, the program executed by the detection device 1000 according to the above embodiment may be configured to be provided by being recorded on a computer-readable recording medium such as a CD-ROM, a flexible disk (FD), a CD-R, a digital versatile disk (DVD) or the like.

In addition, the program executed by the detection device 1000 according to the above embodiment may be configured to be provided by being stored on a computer connected to a network such as the Internet and being downloaded via the network. In addition, the program for executing each of the processes in the detection device 1000 according to the above embodiment may be configured to be provided or distributed via a network such as the Internet.

The program for executing various processes performed by the detection device 1000 according to the above embodiment allows the above-described respective units to be generated on a main storage device.

Various types of information stored in the HDD 86, that is, various types of information stored in the storage 14 may be stored in an external device (for example, a server). In this case, t external device and the CPU 80 may be configured to be connected through the I/F unit 68.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photodetector comprising:
   a first photoelectric conversion element including a first photoelectric conversion layer for converting energy of radiation into electric charges;
   a second photoelectric conversion element including a second photoelectric conversion layer for converting energy of radiation into electric charges; and
   an absorption layer arranged between the first photoelectric conversion element and the second photoelectric conversion element to absorb radiation having energy equal to or lower than a threshold value, wherein
   the threshold value is a value larger than a maximum value of energy of radiation that is photoelectrically convertible by the first photoelectric conversion element arranged on an up side of the absorption layer in an incident direction of the radiation and smaller than a maximum value of energy of radiation that is photoelectrically convertible by the second photoelectric conversion element arranged on a down side of the absorption layer in the incident direction of the radiation.

2. The photodetector according to claim 1, wherein the absorption layer includes an organic material.

3. The photodetector according to claim 1, wherein the absorption layer has a thickness of 7 μm or more and 30 mm or less.

4. The photodetector according to claim 1, wherein the absorption layer includes a plurality of regions having at least different one of thickness, constituent material, and density parallel to a light receiving surface of the radiation.

5. The photodetector according to claim 1, wherein
   the first photoelectric conversion element includes an electrode being in contact with the first photoelectric conversion layer, and
   the second photoelectric conversion element includes an electrode being in contact with the second photoelectric conversion layer.

6. The photodetector according to claim 1, wherein at least one of the first photoelectric conversion element and the second photoelectric conversion element further includes a scintillator for converting the radiation into scintillation light.

7. The photodetector according to claim 1, wherein the radiation is beta rays.

8. A detection device comprising:
   the photodetector according to claim 1;
   a calculator configured to calculate a signal ratio of a first output signal according to one or more electric charges obtained from the conversion in the first photoelectric conversion element and a second output signal according to one or more electric charges obtained from the conversion in the second photoelectric conversion element as an evaluation value of the incident radiation; and
   a specifier configured to specify incident energy corresponding to the calculated evaluation value in a conversion table where the evaluation value and the incident energy of radiation are in correspondence to each other as detection energy of radiation.

9. The photodetector according to claim 5, further comprising:
   a calculator configured to calculate a signal ratio of a first output signal according to one or more electric charges obtained from the conversion in the first photoelectric conversion element and a second output signal according to one or more electric charges obtained from the conversion in the second photoelectric conversion element.

* * * * *